United States Patent [19]

Kamata

[11] Patent Number: 5,075,581

[45] Date of Patent: Dec. 24, 1991

[54] ECL TO TTL VOLTAGE LEVEL CONVERTER USING CMOS AND BICMOS CIRCUITRY

[75] Inventor: Shinnosuke Kamata, Tokyo, Japan

[73] Assignee: Fujitsu Limited, Kawasaki, Japan

[21] Appl. No.: 557,706

[22] Filed: Jul. 25, 1990

[30] Foreign Application Priority Data

Jul. 25, 1989 [JP] Japan .................................. 1-192031

[51] Int. Cl.[5] .................. H03K 19/092; H03K 19/094
[52] U.S. Cl. .................................... 307/475; 307/446; 307/570; 307/448; 307/451
[58] Field of Search ............... 307/475, 446, 570, 448, 307/451

[56] References Cited

U.S. PATENT DOCUMENTS

| | | | |
|---|---|---|---|
| 4,471,242 | 9/1984 | Noufer et al. | 307/475 |
| 4,485,317 | 11/1984 | Davies, Jr. | 307/475 |
| 4,486,670 | 12/1984 | Chan et al. | 307/475 |
| 4,514,651 | 4/1985 | Miller et al. | 307/475 |
| 4,532,436 | 7/1985 | Bismarck | 307/475 |
| 4,677,320 | 6/1987 | Hannington | 307/475 |
| 4,716,312 | 12/1987 | Mead et al. | 307/475 |
| 4,931,673 | 6/1990 | Naghshinel | 307/475 |

FOREIGN PATENT DOCUMENTS 0079641  5/1984  Japan ................................. 307/446

Primary Examiner—Stanley D. Miller
Assistant Examiner—Scott A. Ouellette
Attorney, Agent, or Firm—Staas & Halsey

[57] ABSTRACT

Additional transistors are serially inserted in a level conversion circuit that configures a flip-flop with N channel transistors and P channel transistors and that outputs TTL level output signals by converting ECL level input signals, so that said additional transistors are turned OFF at the same time as the P channel transistors, connected serially with the N channel transistors, are turned ON. This above described process will prevent a through current flowing between positive and negative power sources, when transistors are switched, thus preventing an increase in the current consumed.

7 Claims, 8 Drawing Sheets

11 LEVEL CONVERSION CIRCUIT

ECL TO TTL VOLTAGE LEVEL CONVERTER USING CMOS AND BICMOS CIRCUITRY

BACKGROUND OF THE INVENTION

This invention relates to a semiconductor device which has a level conversion circuit that converts different levels of logical signals, and particularly to a semiconductor device with an ECL/TTL level conversion circuit that converts ECL level logical signals into TTL level logical circuits.

Generally, digital circuit elements have so-called Standard Logic for general purpose use and are classified into ECL systems, TTL systems, CMOS systems, etc. These standard logic units are widely used. For example, ECL system units are used for high speed operation components of CPUs and the like because of their superior signal transmission characteristics, while TTL system units are used for failure-free logical circuits because of their high noise tolerance.

These standard logic units have logic levels peculiar to their systems. For instance, the ECL system has a logic level between the $-4.5$ V (or 5.2 V) constant power source $V_{EE}$ on the negative side and the constant power source GND on the ground side, whereas the TTL system has a logic level between the $+5$ V constant power source $V_{CC}$ on the positive side and constant power source GND on the ground side. Therefore, signal transmission between different standard logic units requires logic level conversion. Level conversion circuits are therefore used for, i.e. standardization or matching of logic levels between different standard logic units. Especially, recently, it has been required that semiconductor devices attain a higher degree of speed and integration due to the development of devices (e.g. computer systems) loaded therewith. Consequently, semiconductors device s tend to consume more electricity, but it is desirable to minimize the consumed current of the devices loaded with semiconductor devices. Therefore, it is necessary to minimize the consumed current of these semiconductor devices as much as possible.

FIG. 1 is an example of conventional ECL/TTL level conversion circuit. In FIG. 1, 1 is a level conversion circuit using a negative voltage power source. The level conversion circuit 1 is configured with a P channel MOS transistor P1 to which gate ECL level input signal IN is input with P1's drain connected with the gate of N channel MOS transistor N2 through output terminal $\overline{OUT}$; a N channel MOS transistor N1, connected serially with P1, whose gate is connected with the drain of a P channel MOS transistor P2 through output terminal OUT; a P channel MOS transistor P2 to which gate the complement signal $\overline{IN}$ of the ECL level input signal IN is input with P2's drain connected with N1's gate through an output terminal OUT, and a N channel MOS transistor N2, connected serially with F2, whose gate is connected with P1's drain through output terminal $\overline{OUT}$. In FIG. 1, IN is an ECL level input signal with $\overline{IN}$ being its complement signal, and OUT is TTL level output signal with $\overline{OUT}$ being its complement signal. $V_{CC}$ refers to a positive voltage power source (GND), and $V_{EE}$ refers to a negative voltage power source.

In this configuration, if "L" level and "H" level are input respectively to inputs IN and $\overline{IN}$, then P1 and N2 become ON and P2 and N1 become OFF. Therefore, the flip-flop configured by P1, P2, N1 and N2 is in a stable condition, and output $\overline{OUT}$ becomes approximately 0V. Meanwhile, if "H" level and "L" level are input respectively to inputs IN and $\overline{IN}$, then P2 and N1 become ON and P1 and N2 become OFF. Therefore, the flip-flop configured by P1, P2, N1 and N2 is in a stable condition, and output $\overline{OUT}$ becomes $V_{EE}$ (approximately $-5.2$ V). These operations convert ECL level signals into TTL level signals.

However, these existing semiconductors have had a problem in that they have failed to reduce the current consumed due to a through current at switching for the reason stated below.

At first, if "L" level and "H" level are input respectively to inputs IN and $\overline{IN}$, transistors P1 and N2 are ON and transistors P2 and N1 are OFF. Next, when the input phase is reversed, the transistors' switching sequence will be performed in such a manner that only after P channel transistors P1 and P2 become OFF and ON respectively, N channel transistors N1 and N2 become ON and OFF respectively. Consequently, both P2 and N2 are ON, when the phase is reversed, and a through current, irrelevant to switching, flows from the positive voltage power source $V_{CC}$ to the negative voltage power source $V_{EE}$. Since the current consumed is the sum of the current required for switching and the through current which is irrelevant to switching, the through current that requires an increase in current consumption is not desirable.

SUMMARY OF THE INVENTION

An object of the present invention is to provide semiconductor devices with a level conversion circuit that can significantly reduce the current consumed by eliminating the through current.

To achieve the stated object, this semiconductor device of the present invention is configured to prevent a through current between the first and second power sources by making the following modification to a conventional semiconductor device with a level conversion circuit that has a P channel transistor to receive ECL level signals at its gate and an N channel transistor connected serially with the particular P channel transistor which is inserted between the first and second power sources, and that converts the ECL level input signals to TTL level output signals by turning these transistors ON and OFF, and that outputs the converted output signal from the connecting point between the particular P channel transistor and the particular N channel transistor. The semiconductor device inserts an predetermined transistor, whose gate is connected with said P channel transistor's gate, in series with said N channel transistor, so that the predetermined transistor becomes OFF at the same time as said P channel transistor becomes ON.

In this invention, an appropriate transistor is inserted serially to the N channel transistor of a level conversion circuit with a P channel transistor and an N channel transistor, and the gate of the predetermined transistor is connected commonly with the gate of the P channel transistor.

Consequently, when, for example, a P channel transistor is switched from OFF to ON, and an N channel transistor is switched from ON to OFF as a result, after the phase reversal of the input signal, even if the N channel transistor is turned OFF slightly after the P channel transistor is turned ON, because the appropriate inserted transistor is turned OFF simultaneously with the turning ON of the P channel transistor, a through current running between the P channel transistor and the N channel transistor is properly cut off. Therefore, the current consumption is prevented from increasing.

DETAILED DESCRIPTION OF THE PREFERRED EMBODIMENTS

Figure 1:
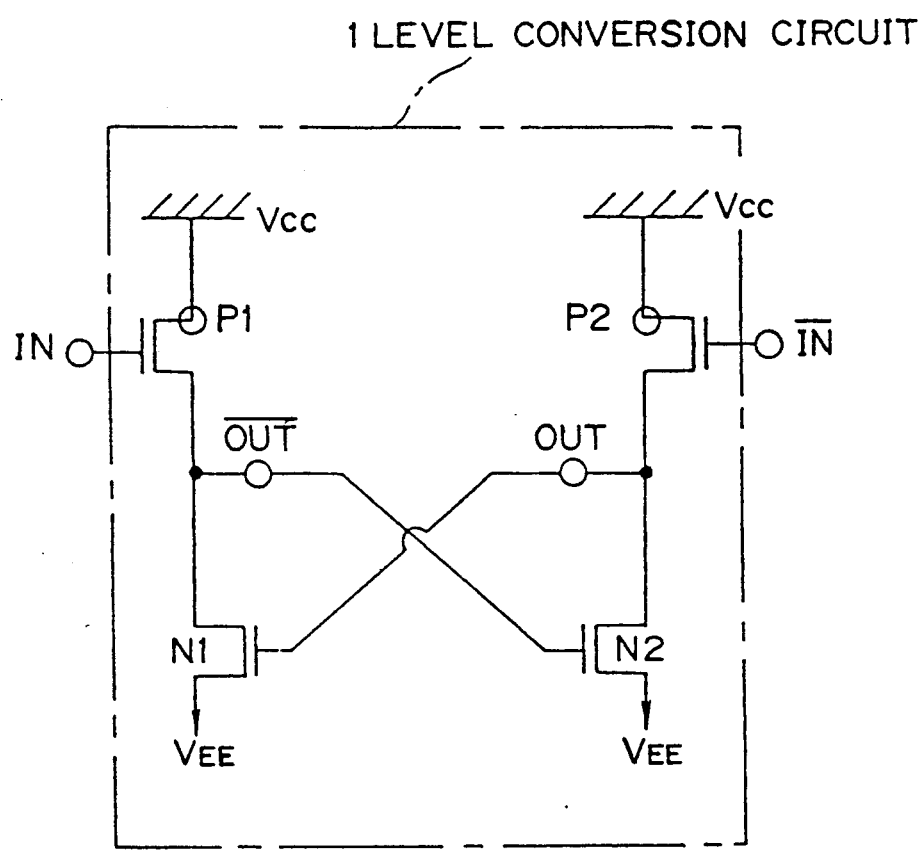
FIG. 1 is a circuit diagram of the conventional level conversion circuit.
Figure 2:
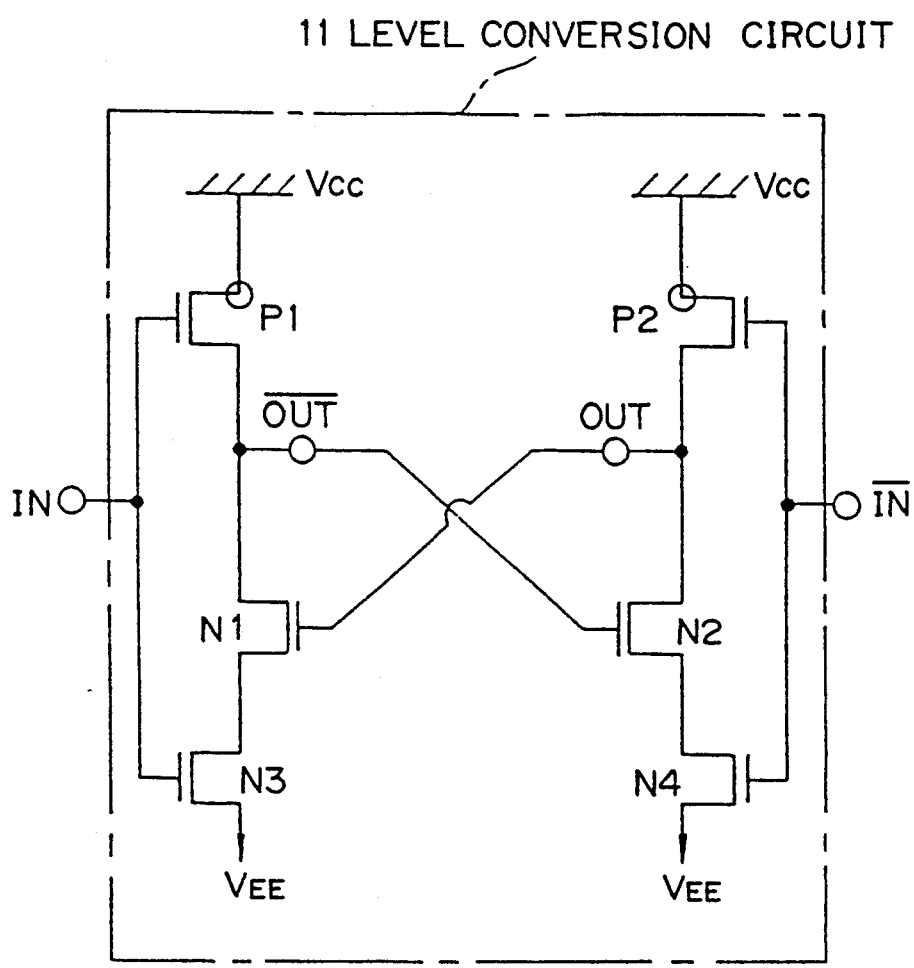
FIG. 2 is a circuit diagram of the first implementing example regarding the level conversion circuit related to the present invention.

An understanding of how to implement the invention can be had by referring to the following explanation together with reference to the drawings. FIG. 2 shows a first example of how to implement this invention. Those components in FIG. 2 which are the same as components in FIG. 1 will be given the same numbers as those given said components in FIG. 1, and a description thereof will be omitted.

In FIG. 2, 11 is the level conversion circuit included in the conventional semiconductor device. A N channel MOS transistor N3 (an appropriate transistor) is inserted between a N channel MOS transistor N1 and $V_{EE}$ (a second power source). Another N channel MOS transistor N4 (an appropriate transistor) is inserted between a N channel MOS transistor N2 and $V_{EE}$. In this case, an ECL level input signal IN is input to N3's gate, and input signal $\overline{IN}$ is input to N4's gate. To summarize, N channel MOS transistors N3 and N4 are serially connected with N channel MOS transistors N1 and N2, respectively. The same input signal IN as that input to a P channel MOS transistor P1 is input to N3's gate. The same input signal $\overline{IN}$ as that input to a P channel MOS transistor P2 is input to N4's gate.

In the above configuration, if "L" level and "H" level signals are initially input to inputs IN and $\overline{IN}$ respectively, then the transistors P1, N2 and N4 are ON and transistors P2, N1 and N3 are OFF. Next, if the input signal phase is reversed and "H" level and "L" level signals are input to the inputs IN and $\overline{IN}$ respectively, then the transistors' switching sequence will, first, to turn P1 and N4 OFF and turn P2 and N3 ON, and, second, turn N1 ON and turn N2 OFF. Consequently, because N4 is turned OFF simultaneously with P2 turning ON, even if the N2 is turned OFF later than P2 is turned ON at input phase reversal, a through current flowing between P2 and N2 is prevented.

Figure 3:
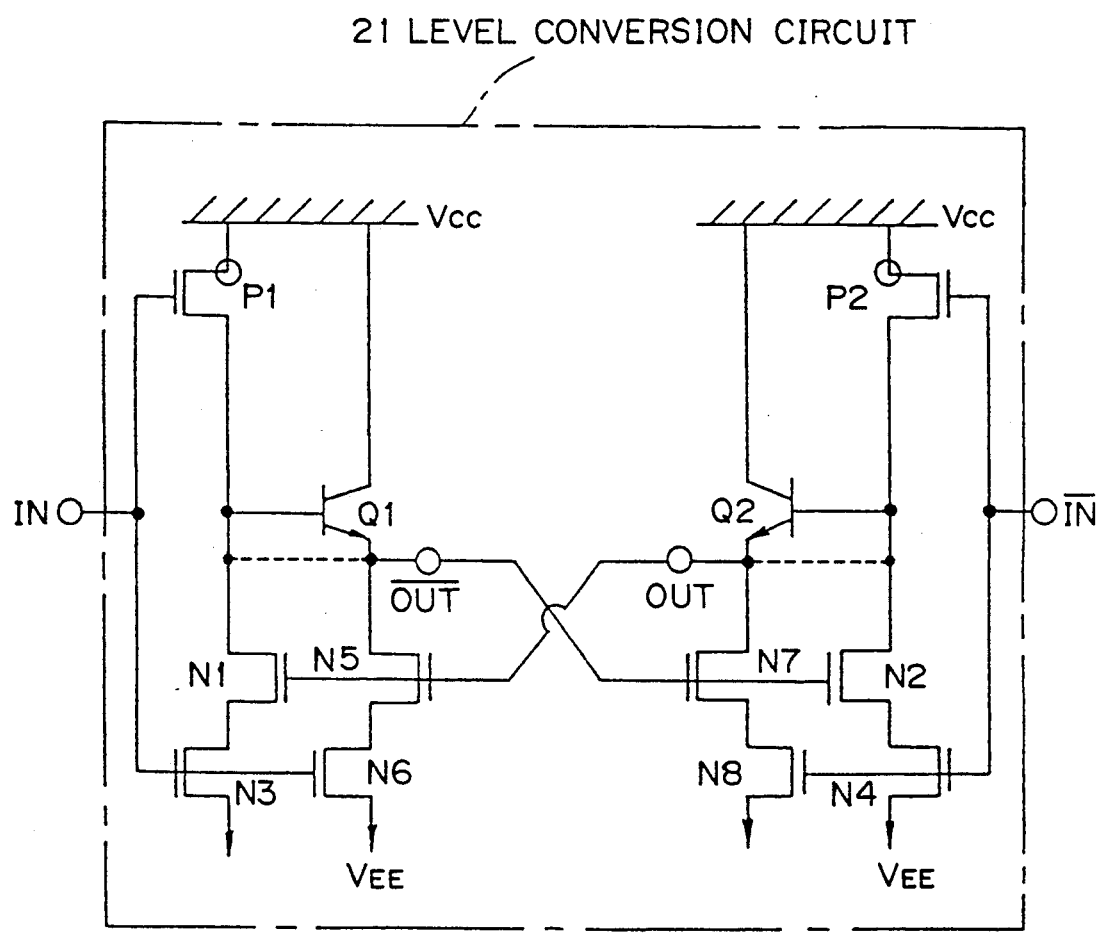
FIG. 3 is a circuit diagram of the second implementing example regarding the level conversion circuit related to this invention.

FIG. 3 is a drawing that shows a second example of how to implement this invention. Those components in FIG. 3 which are the same as components in FIG. 2 will be given the same numbers as those given said components in FIG. 2.

In FIG. 3, 21 is a level conversion circuit which has bipolar transistors Q1 and Q2 as well as N channel MOS transistors N5 and N7 in a single stage to enhance drive ability. Just in the same way as N channel MOS transistors N3 and N4 are inserted respectively between N1 and $V_{EE}$ and between N2 and $V_{EE}$, N channel MOS transistors N6 and N8 are inserted respectively between N5 and $V_{EE}$ and between N7 and $V_{EE}$ in series. Additionally, gates of transistors N3 and N6 are input with the same input signal IN as that of transistor P1, and gates of transistors N4 and N8 are input with the same input signal $\overline{IN}$ as that of transistor P2. Accordingly, the level conversion circuit 21 has the circuit configuration in which transistors N3, N6, N4 and N8 are inserted in the not-drawn existing level conversion circuit configured by P1, P2, N1, N2, N5, N7, Q1 and Q2, so that a through current is prevented.

In the above configuration, if "L" level and "H" level signals are initially input to inputs IN and $\overline{IN}$ respectively, then the transistors P1, Q1, N2, N4, N7 and N8 are ON and transistors P2, Q2, N1, N3, N5 and N6 are OFF. Next, if the input signal phase is reversed and "H" level and "L" level signals are input to the inputs IN and $\overline{IN}$ respectively, then the transistors' switching sequence will, first, turn P2, N3 and N6 ON and turn P1, N4 and N8 OFF, and, second, turn Q2, N1 and N5 ON and turn Q1, N2 and N7 OFF. Consequently, because N4 and N8 are turned OFF simultaneously with P2 turning ON, both a through current flowing among P2, N2 and N4 and another flowing among Q2, N7 and N8 are prevented.

As depicted, this example shows how a through current in level conversion circuit 21 is prevented, thereby having the effect of reducing the current consumed by level conversion circuit 21, which current reduction will greatly contribute to the improvement of performance of the semiconductor devices.

The circuit in the above FIG. 3 is an example in which transistors N3, N4, N6 and N8 are attached to the source side of N channel MOS transistors N1, N2, N5 and N7 to prevent a through current. However, transistors N3, N4, N6 and N8 can be attached to the drain side of N channel MOS transistors N1, N2, N5 and N7. An example in which such a configuration is implemented is described below.

Figure 4:
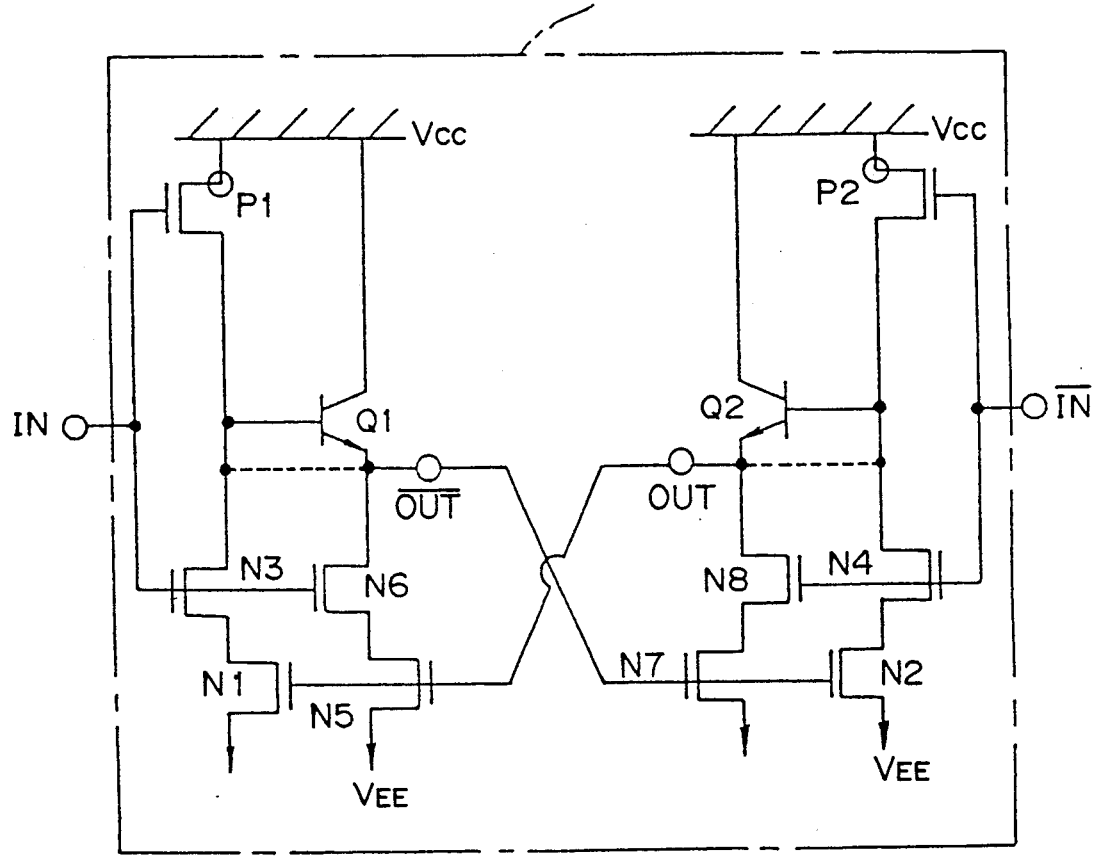
FIG. 4 is a circuit diagram of the third implementing example regarding the level conversion circuit related to this invention.

FIG. 4 is a drawing that shows a third example of how to implement this invention. Those components in FIG. 4 which are the same as components of the second example in FIG. 3 will be given the same numbers as those given said components in FIG. 3.

In FIG. 4, 31 is a level conversion circuit which has a circuit configuration with transistors N3, N6, N4 and N8 attached to the drain side of N channel MOS transistors N1, N5, N7 and N2, so that a through current is prevented.

This level conversion circuit 31 works in the same manner as the level conversion circuit 11 in the first example implementation. In essence, because transistors P1, N3, N6 and P2, N4, N8 switch simultaneously, a through current is prevented and an effect similar to that attained in the second example can be attained.

Figure 5:
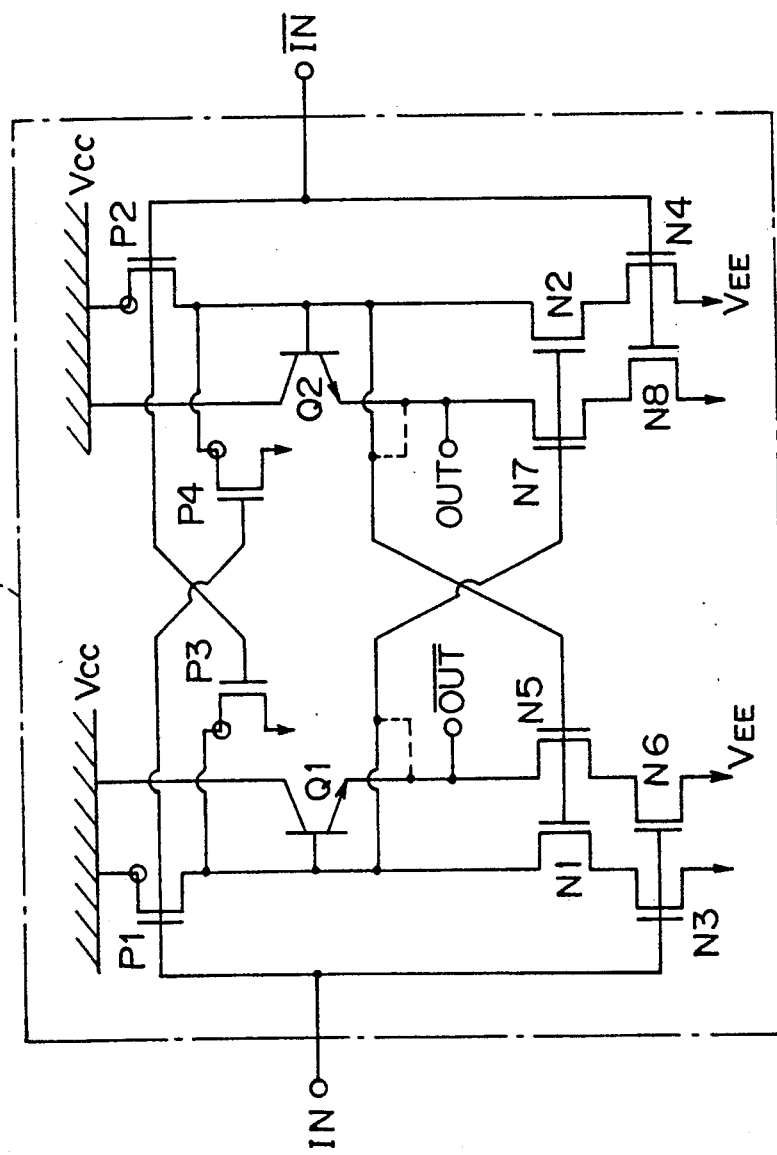
FIG. 5 is a circuit diagram of the fourth implementing example regarding the level conversion circuit related to this invention.

FIG. 5 is a drawing that shows a fourth example of how to implement this invention. Those components in FIG. 5 which are the same as components in FIG. 3 will be given the same numbers as those given said components in FIG. 3 and a description thereof will be omitted.

In FIG. 5, 41 is a level conversion circuit which has bipolar transistors Q1 and Q2, as well as P channel MOS transistors P3 and P4 to improve the switching speed of the level conversion circuit. P channel MOS transistor P3 is installed between the bipolar transistor Q1's base and $V_{EE}$ transistor P3's gate is connected with P channel MOS transistor P2's gate. Also, a P channel MOS transistor P4 is installed between the bipolar transistor Q2's base and $V_{EE}$. Transistor P4's gate is connected with P channel MOS transistor P1's gate.

Incidentally, gates of N channel MOS transistors N2 and N7 are connected with the connecting point between a P channel MOS transistor P1 and a N channel MOS transistor N1. Gates of N channel MOS transistors N1 and N5 are connected with the connecting point between a P channel MOS transistor P2 and a N channel MOS transistor N2. In the same manner as shown FIG. 3, i.e. as indicated by the dashed lines in FIG. 5, the gates of N channel MOS transistors N2 and N7 and those of N channel MOS transistors N1 and N5 can be connected with the emitter sides of the bipolar transistors Q1 and Q2, respectively.

In the above configuration, if the transistor P4 is not installed, when the output OUT changes from "H" level to "L" level, the transistors' switching sequence will, first, turn transistor P1 ON simultaneously with turning transistor P2 OFF, and, second, turn transistor N2 ON and then turn transistor Q2 OFF, so OUT is finally converted to "L" level. Meanwhile, if the transistor P4 is installed, when output OUT is converted from "H" level to "L" level, the transistors' switching sequence will, first, turn transistor P2 OFF and turn transistor P4 ON concurrently with transistor P1 turning ON, and subsequently, turn transistor N2 ON concurrently with transistor Q2 turning OFF by accompanying transistor P4 turning ON, so the transistor Q2 is turned OFF faster. In other words, installation of the transistor P4 enables transistor Q2's base charges to be pulled off without having to wait for transistor N2 switching to become OFF from ON, which enhances transistor Q2's switching response. Likewise, installation of the transistor P3 enhances transistor Q1's switching response.

Of course, in the above configuration, a through current is eliminated as in the other previously described configurations.

Figure 6:
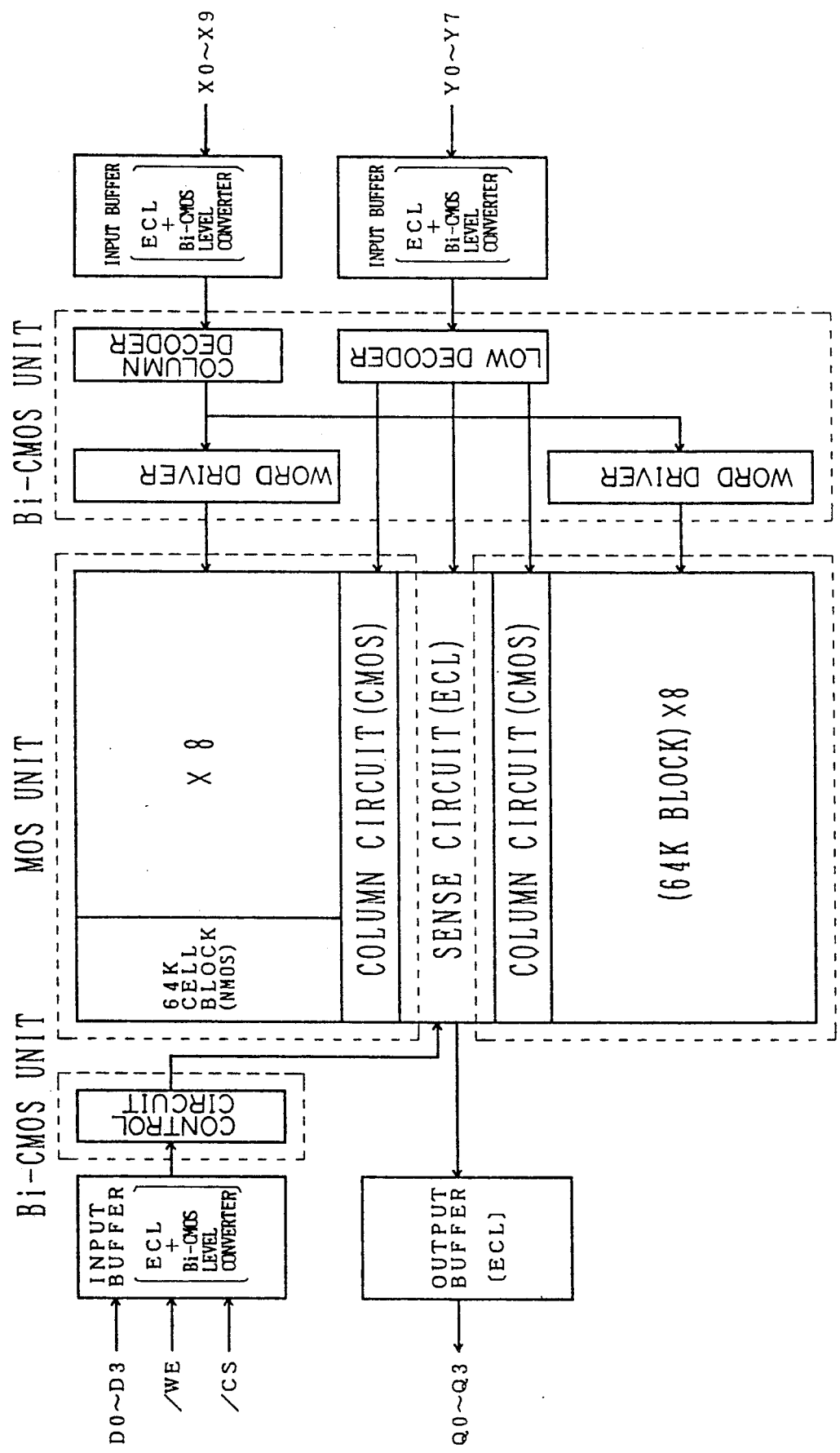
FIG. 6 is a block diagram of a commonly used ECL RAM configuration with a level conversion circuit.
Figure 7:
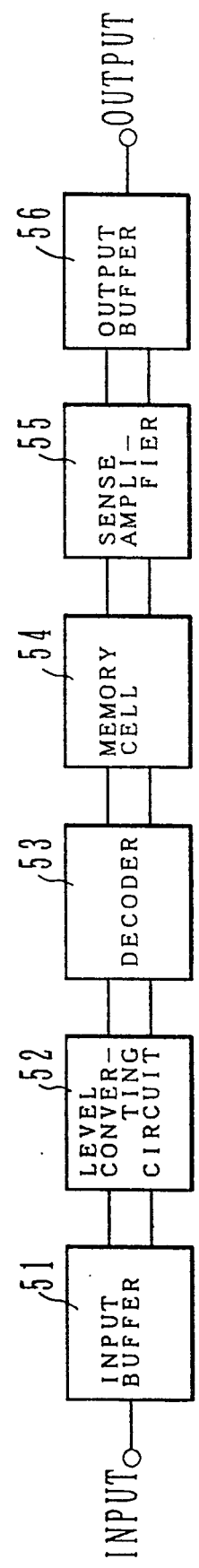
FIG. 7 is a scheme showing the position of a level conversion circuit in an ECL RAM.
Figure 8:
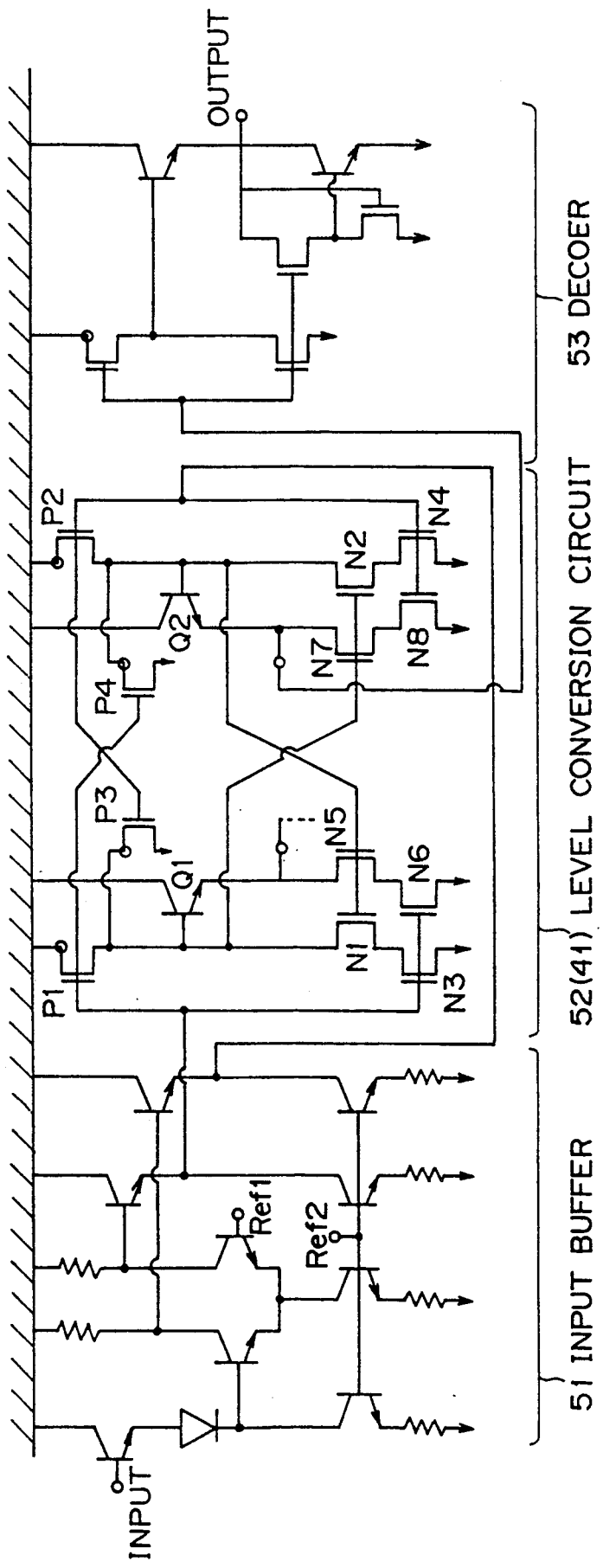
FIG. 8 is a circuit diagram of an input buffer 51, a level conversion circuit 52 and a decoder 53, regarding the ECL RAM related to this invention in the fourth implementing example.

FIG. 6 shows a commonly used ECL RAM configuration which is an example of a semiconductor device with a level conversion circuit. As shown in FIG. 7, such a RAM is configured with an input buffer 51, a level conversion circuit 52, a decoder 53 a memory cell 54, a sense amplifier 55 and an output buffer 56, with the level conversion circuit 52 inserted between the input buffer 51 and the decoder 53. FIG. 8 shows a concrete circuit configuration with such an input buffer 51, a level conversion circuit 52 and a decoder 53. A level conversion circuit 41 of the fourth implementation example shown in FIG. 5 is used as an example. The circuit configurations of an input buffer 51 and a decoder 53 shown in FIG. 8 are common and as these configurations are not directly related to the essence of this invention, an explanation thereof is omitted.

Finally, this invention is applicable not only to the RAM discussed above but also to various sorts of semiconductor devices requiring a level conversion circuit ranging from the ECL level to TTL level.

This invention brings about a big reduction in the current consumed by eliminating a through current, and it improves the performance of semiconductor devices.

What is claimed is:

1. A semiconductor device comprising:
    a P channel transistor inserted between first and second power sources for receiving ECL level input signals at its gate and for outputting output signals at its drain,
    an N channel transistor connected in series with said P channel transistor and having a gate,
    level conversion means for receiving complement input signals to said ECL level input signals and for converting a level of said complement input signals and for outputting to the gate of said N channel transistor reversed signals of said output signals, the reversed signals being synchronized with said output signals,
    a predetermined transistor coupled in series with said N channel transistor, and
    means for connecting the gate of said predetermined transistor to the gate of said P channel transistor, so that said predetermined transistor is turned off at the same time that said P channel transistor is turned on, thereby preventing a through current between said first and second power sources.

2. A semiconductor device comprising:
    a first terminal input terminal for inputting ECL level input signals,
    a second input terminal for inputting complement signals to said ECL level input signals,
    a first P channel MOS transistor, inserted between a first power source and a second power source, that receives said ECL level input signals at its gate through said first input terminal,
    a first N channel MOS transistor serially inserted between said first P channel MOS transistor and said second power source,
    a second P channel MOS transistor, inserted between said first power source and said second power source, for receiving the complement signals to said ECL level input signals at its gate through said second input terminal,
    a second N channel MOS transistor inserted serially between said second P channel MOS transistor and said second power source,
    a third N channel MOS transistor, inserted either between said first P channel MOS transistor and said first N channel MOS transistor or between said first N channel MOS transistor and said second power source, whose gate is connected to the gate of said first P channel MOS transistor,
    a fourth N channel MOS transistor, inserted between said second N channel MOS transistor and said second power source, whose gate is connected to the gate of said second P channel MOS transistor,
    a first output terminal, positioned at a drain of said second P channel MOS transistor, for outputting TTL level output signals and transmitting the output signals to said first N channel MOS transistor's gate, and
    a second output terminal, positioned at a drain of said first P channel MOS transistor, for outputting the complement signals to said TTL level output signals and transmitting said complement signals to said second N channel MOS transistor's gate.

3. A semiconductor device comprising:
a first terminal input terminal for inputting ECL level input signals,
a second input terminal for inputting complement signals to said ECL level input signals,
a first P channel MOS transistor, inserted between a first power source and a second power source, that receives said ECL level input signals at its gate through said first input terminal,
a first N channel MOS transistor serially inserted between said second P channel MOS transistor and said second power source,
a second P channel MOS transistor, inserted between said first power source and said second power source, for receiving the complement signals to said ECL level input signals at its gate through said second input terminal,
a second N channel MOS transistor inserted serially between said second P channel MOS transistor and said second power source,
a third N channel MOS transistor, inserted either between said first P channel MOS transistor and said first N channel MOS transistor or between said first N channel MOS transistor and said second power source, whose gate is connected to the gate of said first P channel MOS transistor,
a fourth N channel MOS transistor, inserted between said second N channel MOS transistor and said second N channel MOS transistor, and whose gate is connected to the gate of said second P channel MOS transistor,
a first output terminal, positioned at a drain of said second P channel MOS transistor, for outputting TTL level output signals and transmitting the output signals to said first N channel MOS transistor's gate, and
a second output terminal, positioned at a drain of said first P channel MOS transistor, for outputting the complement signals to said TTL level output signals and transmitting said complement signals to said second N channel MOS transistor's gate.

4. A semiconductor device comprising:
a first terminal input terminal for inputting ECL level input signals,
a second input terminal for inputting complement signals to said ECL level input signals,
a first P channel MOS transistor, inserted between a first power source and a second power source, for receiving ECL level input signals through said first input terminal at its gate,
a first N channel MOS transistor inserted serially between said first P channel MOS transistor and said second power source,
a second P channel MOS transistor, inserted between said first power source and said second power source, for receiving the complement signals to said ECL level input signals through said second input terminal at its gate,
a second N channel MOS transistor serially inserted between said second P channel MOS transistor and said second power source,
a third N channel MOS transistor, inserted between said first N channel MOS transistor and said second power source, and whose gate is connected to said first P channel transitor's gate,
a fourth N channel MOS transistor, inserted between said second N channel MOS transistor and said second power source, and whose gate is connected to said second P channel MOS transistor's gate,
a first bipolar transistor, inserted between said first power source and said second power source, whose base is connected to the connecting point between said first P channel MOS transistor and said first N channel MOS transistor,
a fifth N channel MOS transistor serially inserted between said first bipolar transistor and said second power source,
a sixth N channel MOS transistor, inserted between said fifth N channel MOS transistor and said second power source, and whose gate is connected to said first P channel MOS transistor's gate,
a second bipolar transistor, inserted between said first power source and said second power source, whose base is connected to the connecting point between said second P channel MOS transistor and said second or fourth N channel MOS transistor,
a seventh N channel MOS transistor serially inserted between said second bipolar transistor and second power source,
an eighth N channel MOS transistor, inserted between said seventh N channel MOS transistor and said second power source, and whose gate is connected to said second P channel MOS transistor's gate,
first output terminal means for outputting TTL level output signals and transmitting said signals to said first N channel MOS transistor's gate and to said fifth N channel MOS transistor's gate, positioned at the connecting point either between an emitter of said second bipolar transistor and said seventh N channel MOS transistor or a base of said second bipolar transistor and said second N channel MOS transistor, and
second output terminal means for outputting complement signals to said TTL level output signals and transmitting said signals to said second N channel MOS transistor's gate and said seventh N channel MOS transistor's gate, positioned at the connecting point either between an emitter of said first bipolar transistor and said fifth N channel MOS transistor or a base of said first bipolar transistor and said first N channel MOS transistor.

5. A semiconductor device comprising:
a first input terminal for inputting ECL level input signals,
a second input terminal for inputting complement signals to said ECL level input signals,
a first P channel MOS transistor, inserted between a first power source and a second power source, for receiving said ECL level input signals through said first input terminal at its gate,
a first N channel MOS transistor inserted serially between said first P channel MOS transistor and said second power source,
a second P channel MOS transistor, inserted between said first and second power sources, for receiving complement signals to said ECL level input signals through said second input terminal at its gate,
a second N channel MOS transistor serially inserted between said second P channel MOS transistor and said second power source,
a third N channel MOS transistor, inserted between said first P channel MOS transistor and said first N channel MOS transistor, whose gate is connected to said second P channel MOS transistor's gate, means for connecting the gate of said predetermined transistor to the gate of said P channel transistor, so that said predetermined transistor is turned off at the same time that said P channel transistor is turned on, thereby preventing a through current between said first and second power soruces.

a first bipolar transistor, inserted between said first power source and said second power source, whose base is connected at the connecting point between said first P channel MOS transistor and said third N channel MOS transistor, a fifth N channel MOS transistor inserted serially between said first bipolar transistor and said second power source, a sixth N channel MOS transistor, inserted between said fifth N channel MOS transistor and said first bipolar transistor, and whose gate is connected with said first P channel MOS transistor's gate, a second bipolar transistor, inserted between said first power source and said second power source, whose base is connected at the connecting point between said second P channel MOS transistor and said second or fourth N channel MOS transistor, a seventh N channel MOS transistor inserted serially between said second bipolar transistor and second power source, an eighth N channel MOS transistor, inserted between said seventh N channel MOS transistor and said second bipolar transistor, and whose gate is connected to said second P channel MOS transistor's gate, first output terminal means for outputting TTL level output signals and transmitting said signals to said first N channel MOS transistor's gate and to said fifth N channel MOS transistor's gate, positioned at the connecting point either between an emitter of said second bipolar transistor and said eighth N channel MOS transistor, or a base of said second bipolar transistor and said fourth N channel MOS transistor, and second output terminal means for outputting complement signals to said TTL level output signals and transmitting said signals to said second N channel MOS transistor's gate and said seventh N channel MOS transistor's gate, positioned at the connecting point either between an emitter of said first bipolar transistor and said sixth N channel MOS transistor or a base of said first bipolar transistor and said first N channel MOS transistor.

6. A semiconductor device comprising:
a first input terminal input terminal for inputting ECL level input signals,
a second input terminal for inputting complement signals to said ECL level input signals,
a first P channel MOS transistor, inserted between a first power source and a second power source, for receiving ECL level input signals through said first input terminal at its gate,
a first N channel MOS transistor inserted serially between said first P channel MOS transistor and said second power source,
a second P channel MOS transistor, inserted between said first and second power sources, for receiving complement signals to said ECL level input signals through said second input terminal at its gate,
a second N channel MOS transistor serially inserted between said second P channel MOS transistor and said second power source, a third N channel MOS transistor, inserted between said first N channel MOS transistor and said second power source, and whose gate is connected with said first P channel MOS transistor's gate, a fourth N channel MOS transistor, inserted between said second N channel MOS transistor and said second power source, and whose gate is connected with said second P channel MOS transistor's gate, a first bipolar transistor, inserted between said first power source and said second power source, whose base is connected at the connecting point between said first P channel MOS transistor and said first N channel MOS transistor, a fifth N channel MOS transistor inserted serially between said first bipolar transistor and said second power source, a sixth N channel MOS transistor, inserted between said fifth N channel MOS transistor and said second power source, and whose gate is connected with said first P channel MOS transistor's gate, a second bipolar transistor, inserted between said first power source and said second power source, whose base is connected at the connecting point between said second P channel MOS transistor and said second N channel MOS transistor, a seventh N channel MOS transistor inserted serially between said second bipolar transistor and second power source, an eighth N channel MOS transistor, inserted between said seventh N channel MOS transistor and said second power source, and whose gate is connected with said second P channel MOS transistor's gate, a third P channel MOS transistor, inserted between said first bipolar transistor's base and said second power source, whose gate is connected with said second P channel MOS transistor's gate, a fourth P channel MOS transistor, inserted between said second bipolar transistor's base and said second power source, whose gate is connected with said first P channel Mos transistor's gate, first output terminal means for outputting TTL level output signals, positioned at the connecting point between said second bipolar transistor and said seventh N channel MOS transistor, and second output terminal means for outputting complement signals to said TTL level output signals, positioned at the connecting point between said first bipolar transistor and said fifth N channel MOS transistor, wherein either the connecting point between said first P channel MOS transistor and said first N channel MOS transistor or the connecting point between said first bipolar transistor and said fifth N channel MOS transistor is connected with the respective gate of said second N channel MOS transistor and said seventh N channel MOS transistor, and the connecting point either between said second P channel MOS transistor and said second N channel MOS transistor or the connecting point between said second bipolar transistor and said seventh N channel MOS transistor, are connected with the respective gate of said first N channel MOS transistor and said fifth N channel MOS transistor.

7. A semiconductor device comprising:
a first input terminal for inputting ECL level input signals, a second input terminal for inputting complement signals to said ECL level input signals, a first P channel MOS transistor, inserted between a first power source and a second power source, for receiving said ECL level input signals through said first input terminal at its gate, a first N channel MOS transistor inserted serially between said first P channel MOS transistor and said second power source, a second P channel MOS transistor, inserted between said first and second power sources, for receiving complement signals to said ECL level input signals through said second input terminal at its gate, a second N channel MOS transistor serially inserted between said second P channel MOS transistor and said second power source, a third N channel MOS transistor, inserted between said first P channel MOS transistor and said first N channel MOS transistor, and whose gate is connected with said first P channel MOS transistor's gate, a fourth N channel MOS transistor, inserted between said second P channel MOS transistor and said second N channel MOS transistor, and whose gate is connected with said second P channel MOS transistor's gate, a first bipolar transistor, inserted between said first power source and said second power source, whose base is connected at the connecting point between said first P channel MOS transistor and said third N channel MOS transistor, a fifth N channel MOS transistor inserted serially between said first bipolar transistor and said second power source, a sixth N channel MOS transistor, inserted between said fifth N channel MOS transistor and said first bipolar transistor, and whose gate is connected with said first P channel MOS transistor's gate, a second bipolar transistor, inserted between said first power source and said second power source, whose base is connected at the connecting point between said second P channel MOS transistor and said fourth N channel MOS transistor, a seventh N channel MOS transistor inserted serially between said second bipolar transistor and second power source, an eighth N channel MOS transistor, inserted between said seventh N channel MOS transistor and said second bipolar transistor, and whose gate is connected with said second P channel MOS transistor's gate, a third P channel MOS transistor, inserted between said first bipolar transistor's base and said second power source, whose gate is connected with said second P channel MOS transistor's gate, a fourth P channel MOS transistor, inserted between said second bipolar transistor's base and said second power source, whose gate is connected with said first P channel Mos transistor's gate, first output terminal means for outputting TTL level output signals, positioned at the connecting point between said second bipolar transistor and said seventh N channel MOS transistor, and second output terminal means for outputting complement signals to said TTL level output signals, positioned at the connecting point between said first bipolar transistor and said sixth N channel MOS transistor, wherein either the connecting point between said first P channel MOS transistor and said third N channel MOS transistor or the connecting point between said first bipolar transistor and said sixth N channel MOS transistor is connected with the respective gate of said second N channel MOS transistor and said seventh N channel MOS transistor, and the connecting point either between said second P channel MOS transistor and said fourth N channel MOS transistor or the connecting point between said second bipolar transistor and said eighth N channel MOS transistor, are connected with the respective gate of said first N channel MOS transistor and said fifth N channel MOS transistor.

* * * * *

UNITED STATES PATENT AND TRADEMARK OFFICE
CERTIFICATE OF CORRECTION

PATENT NO. : 5,075,581
DATED : December 24, 1991
INVENTOR(S) : Shinnosuke KAMATA Page 1 of 3

It is certified that error appears in the above-indentified patent and that said Letters Patent is hereby corrected as shown below:

Col. 1, line 23, change "5.2" to -- -5.2 --;
line 37, change "device s" to --devices--;
line 57, change "F2" to --P2--.
Col. 2, line 7, change "-- ·5.2" to -- -5.2--;

Col., 5, line 10, change "$V_{EE}$ transistor" to --$V_{EE}$. Transistor--.
Col. 7, (claim 3), line 2, delete "terminal" (first occurrence);
Col. 7, (claim 3), line 28, change "N" to --P--.
Col. 7, (claim 4), line 43, delete "terminal" (first occurrence);

UNITED STATES PATENT AND TRADEMARK OFFICE
CERTIFICATE OF CORRECTION

PATENT NO. : 5,075,581
DATED : December 24, 1991
INVENTOR(S) : Shinnosuke KAMATA It is certified that error appears in the above-indentified patent and that said Letters Patent is hereby corrected as shown below:

Col. 9, (claim 5), delete lines 1-6 and insert the following:
--a fourth N channel MOS transistor, inserted between said second P channel MOS transistor and said second N channel MOS transistor, whose gate is connected to said second P channel MOS transistor's gate,--;

Col. 9, (claim 5), line 25, after "and" insert --said--.

Col. 10, (claim 6), line 41, change "Mos" to --MOS--.

Col. 12, (claim 7), line 18, change "Mos" to --MOS--;

UNITED STATES PATENT AND TRADEMARK OFFICE
CERTIFICATE OF CORRECTION

PATENT NO. : 5,075,581
DATED : December 24, 1991
INVENTOR(S) : Shinnosuke KAMATA It is certified that error appears in the above-indentified patent and that said Letters Patent is hereby corrected as shown below:

Col. 12, (claim 7), line 22, change "seventh" to --eighth--.

Signed and Sealed this

Fifteenth Day of April, 1997

*Attest:*

BRUCE LEHMAN

*Attesting Officer*      *Commissioner of Patents and Trademarks*